United States Patent
Kozicki et al.

(10) Patent No.: US 9,997,818 B2
(45) Date of Patent: Jun. 12, 2018

(54) TRANSMISSION DEVICE WITH DIPOLE ORIENTING SYSTEM

(71) Applicant: Alcatel-Lucent, Boulogne-Billancourt (FR)

(72) Inventors: Bartlomiej Kozicki, Berchem (BE); Eric Van Den Berg, Nijlen (BE)

(73) Assignee: Alcatel Lucent, Boulogne-Billancourt (FR)

(*) Notice: Subject to any disclaimer, the term of this patent is extended or adjusted under 35 U.S.C. 154(b) by 0 days. days.

(21) Appl. No.: 14/654,797

(22) PCT Filed: Jan. 13, 2014

(86) PCT No.: PCT/EP2014/050433
§ 371 (c)(1),
(2) Date: Jun. 22, 2015

(87) PCT Pub. No.: WO2014/111324
PCT Pub. Date: Jul. 24, 2014

(65) Prior Publication Data
US 2015/0334819 A1    Nov. 19, 2015

(30) Foreign Application Priority Data
Jan. 16, 2013 (EP) .................................... 13305043

(51) Int. Cl.
*H01P 3/08* (2006.01)
*H01P 3/02* (2006.01)
(Continued)

(52) U.S. Cl.
CPC ............... *H01P 3/026* (2013.01); *H01P 3/08* (2013.01); *H05K 1/024* (2013.01); *H05K 1/0256* (2013.01);
(Continued)

(58) Field of Classification Search
CPC ........... H01P 3/026; H01P 3/08; H05K 1/024; H05K 1/0256; H05K 1/0218; H05K 1/0245; H05K 1/162; H05K 2201/0738
(Continued)

(56) References Cited

U.S. PATENT DOCUMENTS 3,575,493 A * 4/1971 Heilmeier ........... G02F 1/13306
                                                          252/299.68
6,980,865 B1 * 12/2005 Wang ...................... A61N 1/16
                                                          174/36
(Continued)

FOREIGN PATENT DOCUMENTS

CN    102007822 A    4/2011
EP    1128459 A2    8/2001
(Continued)

OTHER PUBLICATIONS

Karen M. Coperich Branch et al., "Physically Consistent Transmission Line Models for High-Speed Interconnects in Lossy Dielectrics", IEEE Transactions on Advanced Packaging, vol. 25, No. 2, May 2002. pp. 129-135.
(Continued)

*Primary Examiner* — Robert J Pascal
*Assistant Examiner* — Kimberly Glenn
(74) *Attorney, Agent, or Firm* — Harness, Dickey & Pierce, P.L.C.

(57) ABSTRACT

Transmission device including at least one electric conductor for the transmission of an AC signal and a dielectric material at least partly surrounding the at least one conductor. The dielectric material includes dipoles. The device further includes a dipole orienting system adapted to orient the dipoles and to force the dipoles in a saturation regime in order to limit the movement of the dipoles when the at least one electric conductor conducts an AC signal.

14 Claims, 3 Drawing Sheets

(51) Int. Cl.
*H05K 1/02* (2006.01)
*H05K 1/16* (2006.01)

(52) U.S. Cl.
CPC ......... *H05K 1/0218* (2013.01); *H05K 1/0245* (2013.01); *H05K 1/162* (2013.01); *H05K 2201/0738* (2013.01)

(58) Field of Classification Search
USPC .......................................................... 333/238
See application file for complete search history.

(56) References Cited

U.S. PATENT DOCUMENTS

| | | |
|---|---|---|
| 2001/0017577 A1 | 8/2001 | Toko et al. |
| 2007/0166126 A1 | 7/2007 | Harney |

FOREIGN PATENT DOCUMENTS

| | | |
|---|---|---|
| JP | 2001-237604 A | 8/2001 |
| JP | 2014-509801 A | 4/2014 |
| WO | WO-2005078856 A1 | 8/2005 |
| WO | WO-2007122409 A1 | 11/2007 |
| WO | WO-2012/123072 A1 | 9/2012 |

OTHER PUBLICATIONS

International Search Report PCT/ISA/210 for International Application No. PCT/EP2014/050433 Dated Apr. 8, 2015.
Written Opinion of the International Searching Authority PCT/ISA/237 for International Application No. PCT/EP2014/050433 Dated Apr. 8, 2015.
Office Action for corresponding Chinese Application No. 102148497 dated Dec. 28, 2015.
Office Action dated Oct. 4, 2016 in Japanese Office Action No. 2015-553049.

* cited by examiner

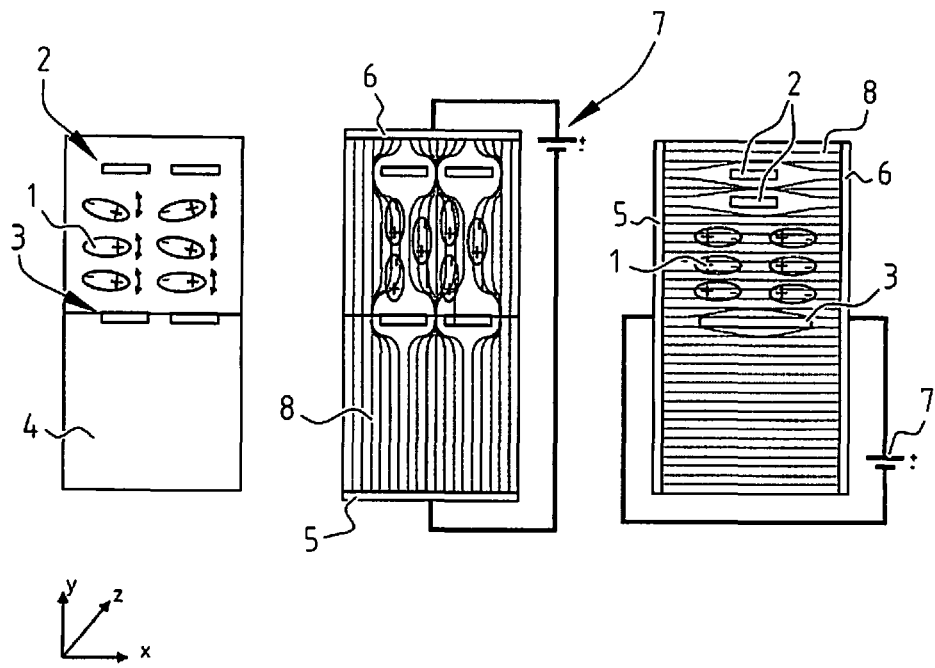
FIG. 1A
PRIOR ART
FIG. 1B
FIG. 1C
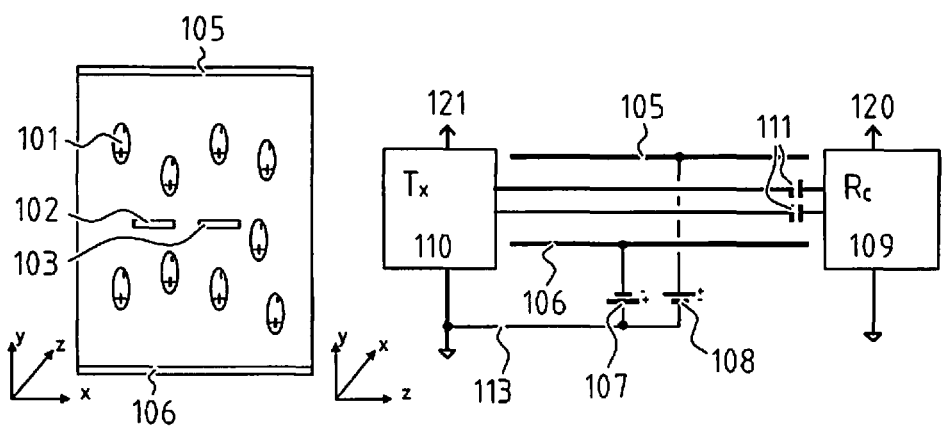
FIG. 2

TRANSMISSION DEVICE WITH DIPOLE ORIENTING SYSTEM

TECHNICAL FIELD

Embodiments of the invention relate to transmission devices, also called interconnects, in which electrical signals are transmitted over one or more conductors which are at least partially surrounded by a dielectric material.

BACKGROUND

Interconnects typically aim to convey a large amount of information between the end points by means of modulation of an electric and/or magnetic field. In order for the modulated signal to be transmitted in an undistorted fashion, the interconnect must possess sufficient bandwidth, i.e. all frequencies composing the signal must preferably experience a low and equal attenuation. As the speed of interconnects is increased to the gigabit per second (Gbps) and multi-Gbps speed, the required bandwidth of the interconnect is also increased.

SUMMARY

The object of embodiments of the invention is to provide an improved transmission device having an increased bandwidth whilst keeping the cost and power consumption limited.

According to an aspect of embodiments the transmission device comprises at least one electric conductor for the transmission of an alternating current (AC) signal and a dielectric material at least partly surrounding the at least one conductor. The dielectric material comprises electrical dipoles. The movement of such dipoles typically affects the conductivity of the conductor at high frequencies. The device further comprises a dipole orienting system adapted to orient said dipoles and to force said dipoles in a saturation regime in order to limit the movement of the dipoles when the at least one electric conductor conducts an AC signal. Such embodiments have the advantage that by biasing the dipoles in the saturation regime the dipole movement due to signal variation becomes negligible. Consequently, the conductivity of the dielectric is decreased, leading to a decrease in dielectric loss of the material, and to an increased bandwidth of the transmission device.

For orienting the dipoles, according to embodiments a high electric field is applied. However, according to other embodiments, the device may be cooled, at least locally, to a low temperature for which the movement of the dipoles is limited. The dipole mobility is an inverse function of the dielectric relaxation time which strongly depends on the temperature. E.g. for a typical printed circuit board material, the dielectric material of the device is preferably cooled to a temperature below −50 degrees Celsius. According to yet other embodiments the orientation of the dipoles may be fixed using a magnetic field/radiation.

According to an embodiment using a high electric field, the dipole orienting system comprises at least one electrode for applying an electric field over the dielectric material using at least one voltage source. In that way, in operation, the at least one voltage source can cause the electric field to force the dipoles into the saturation regime. The voltage source and the location of the at least one electrode is preferably such that an electric field obtained in the dielectric material is higher than 1 kV/cm, preferably higher than 2 kV/cm, more preferably higher than 10 kV/cm. It is noted that the required value for the electric field depends on the type of dielectric material, but for typical printed circuit board (PCB) materials the above values are preferred.

According to a preferred embodiment the device comprises at least two conductors coupled to each other through the dielectric material. Especially for this type of interconnects the invention is useful because this type of interconnects is typically used on a PCB containing a relatively high amount of dipoles if it is desirable to keep the cost low. Also for PCB's the presence of dipoles typically improves the adherence to the copper of the conductors, and therefore it is preferable to have a dielectric material containing dipoles.

According to a typical embodiment the transmission device further comprises a transmitter and a receiver, wherein the at least one conductor extends between the transmitter and the receiver. According to a possible embodiment thereof the transmitter, the receiver and an electrode of the at least one electrode are connected to a voltage reference, typically a ground reference, and the at least one voltage source is applying a voltage between the voltage reference, typically the ground reference, and the at least one conductor. According to another variant the transmitter and the receiver are connected to a voltage reference, typically a ground reference, and each voltage source is applying a voltage between an electrode of the at least one electrode and the voltage reference, typically the ground reference.

The transmission device preferably comprises a PCB, and the dielectric material is formed by the dielectric material of the PCB. The at least one conductor may be located on an outer side of the PCB or may be embedded in the PCB. The at least one electrode may be located on an outer side of the PCB or may be embedded in the PCB.

Preferably the at least one conductor is part of any one of the following: a differential pair microstrip, a strip line, a shielded or unshielded twisted pair, a coaxial cable.

According to another aspect the dipole orienting system comprises one electrode and a supply voltage circuit for applying a voltage difference between the electrode and the at least one conductor such that an electric field is created in the dielectric material, said at least voltage difference being such that the electric field forces the dipoles in the saturation regime. According to a variant thereof the dipole orienting system comprises a first and a second electrode, located at opposite sides of the at least one conductor, and a supply voltage circuit for applying a voltage difference between the first and the second electrode such that an electric field is created in the dielectric material, said voltage difference being such that the electric field forces the dipoles in the saturation regime.

According to preferred embodiments each electrode and each conductor take the form of a metal strip. Further each electrode preferably has a width which is larger than the width of a conductor, and the at least one electrode and at least one conductor are preferably arranged parallel to each other.

BRIEF DESCRIPTION OF THE FIGURES

The accompanying drawings are used to illustrate presently preferred non-limiting exemplary embodiments of devices. The above and other advantages of the features and objects will become more apparent and the invention will be better understood from the following detailed description when read in conjunction with the accompanying drawings, in which:

FIGS. 1A-C illustrate schematically the principles of embodiments;

FIG. 2 illustrates a first embodiment of a transmission device;

Figure 3:
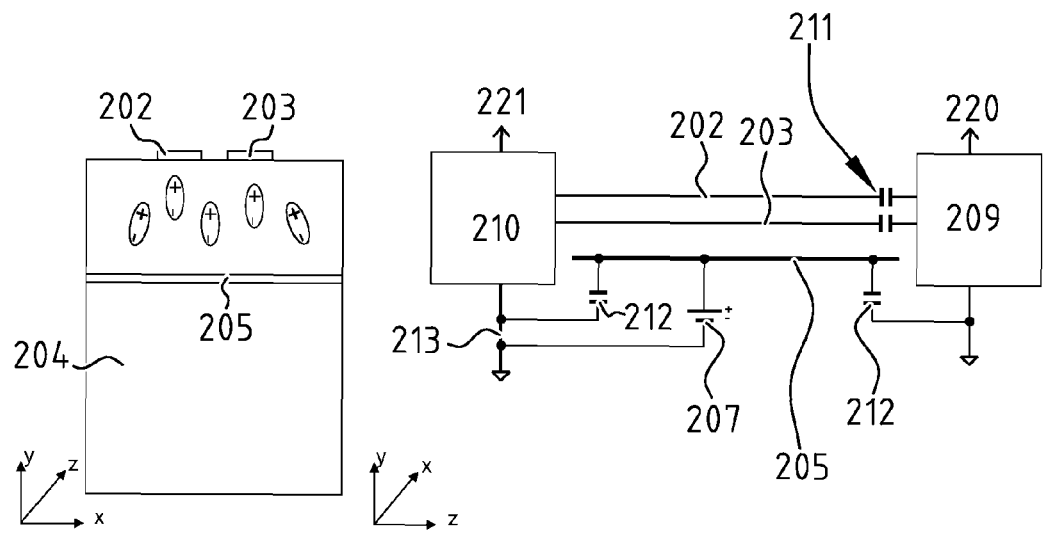
FIG. 3 illustrates a second embodiment of a transmission device.

The transmission of high-frequency signal components is generally limited by the frequency-dependent losses of the transmission system consisting of conductor losses and dielectric losses. Typically, conductor losses dominate at low frequency, while dielectric losses dominate at higher frequencies (>~1 GHz). Both loss components are typically defined per length of interconnect, which means that the speed has to be traded off if longer transmission distance is required. The problem of frequency-dependent losses has been addressed in a number of ways, each of them leading to an increase in overall system cost. The most typical solutions are:

lowering the serial interconnect rate and introducing multiple parallel interconnects, resulting in an additional cost of transceivers and conductors, and an increase in power consumption;

employing more expensive low-loss materials;

shortening the interconnect length and using repeaters, resulting in an additional cost of the repeaters, as well as in an increase of the power consumption;

using advanced modulation formats, such as pulse-amplitude modulation with 4 levels instead non-return to zero, however requiring a more sophisticated transceiver, and resulting in an increase of the cost and the power consumption.

applying pre-emphasis at the transmitter and/or equalization at the receiver to compensate the frequency dependant losses, requiring more sophisticated transceivers.

The generic concept of embodiments is to solve the aforementioned problem by reducing the loss component affecting the high frequencies of the signal. In embodiments we propose the concept of reducing the dielectric loss through material loss tangent modification.

The signal and return path in an interconnect forms a capacitor. An ideal capacitor with air as the dielectric has an infinite direct current (DC) resistance. The current through an ideal capacitor is given by:

$$I = C_0 \frac{dV}{dt} = C_0 \omega V_0 \cos(\omega t)$$

where:
I=the current through the capacitor
V=the applied voltage which is assumed to be a sine wave given by V0 sin(wt);
C0=the capacitance of the capacitor
ω=the angular frequency, in radians/sec
V0=the amplitude of the voltage sine wave applied across the capacitor.

If the ideal capacitor were to be filled with an insulator with a dielectric constant of ∈r, the capacitance would increase to C=∈r×C0. However, real dielectric materials have resistivity associated with them. The mechanism for flow of alternating current (AC) in a dielectric is by the re-orientation of permanent electric dipoles in the material. When a voltage is applied across a capacitor, an electric field is generated. This field will cause some randomly oriented dipoles in the dielectric to align with the field. The motion of the negative end of the dipole toward the positive electrode and the positive end of the dipole to the negative electrode looks like a transient current through the material. If the voltage applied is a sine wave, the dipoles will be rotated sinusoidally back and forth. This motion gives rise to an AC current. The higher the sine-wave frequency, the faster the charges will rotate back and forth and the higher the current. Consequently, the higher the current, the lower the bulk resistivity will be at that frequency. The resistivity of the material is decreasing with increasing frequency. If the movements of the dipoles are able to follow the externally applied field and move the same distance for the same applied field, the current they create, and the bulk conductivity of the material, will increase linearly with frequency. Their conductivity is constant from DC until some frequency is reached and then it begins to increase and continues increasing, proportional to the frequency. At frequencies above this transition frequency, where the motion of dipoles plays a significant role, there can be a very high-leakage current through a real capacitor. This current will be in phase with the voltage and will look like a resistor. At higher frequencies, the leakage resistance will go down and the power dissipated will go up causing the dielectric to heat up. At low frequency, the leakage resistance of a dielectric material is constant and a bulk conductivity is used to describe the electrical properties of the material.

This bulk conductivity is related to the density and mobility of ions in the material. At high frequency, the conductivity increases with frequency due to the increasing motion of the dipoles. The more dipoles there are in the material that can rotate, the higher the bulk conductivity of the material. Also, the farther the dipoles can move with an applied field, the higher the conductivity. To describe this property material dissipation factor is defined as:

$$\sigma = 2\pi \in_0 \in_r \tan(\delta)$$

where:
σ=the bulk AC conductivity of the dielectric;
f=the sine-wave frequency, in Hz;
∈0=the permittivity of free space, 8.89×10−14 F/cm; ∈r=the relative dielectric constant, dimensionless; tan(δ)=the dissipation of the material, dimensionless;

The dissipation factor, written as the tangent of the loss angle, tan(δ), and also abbreviated as Df, is a measure of the number of dipoles in the material and how far each of them can rotate in the applied field:

$$\tan(\delta) \sim n^* p^* \Theta_{max}$$

where:
tan(δ)=the dissipation factor, Df;
n=the number density of dipoles in the dielectric;
p=the dipole moment, a measure of the charge and separation of each dipole;
θ$_{max}$=how far the dipoles rotate in the applied field As the frequency increases, the dipoles move the same distance, but faster, so the current increases and the conductivity increases.

The current through a real capacitor, with an applied sine-wave voltage, can be described by two components. One component of the current is out of phase with the voltage and contributes to the current through an ideal lossless capacitor. The other current component is in phase with the applied-voltage wave and looks like the current passing through an ideal resistor, contributing to loss. To describe these out-of-phase and in-phase components, a formalism can be established based on complex numbers. The current through capacitor is described as $$I = C\frac{dV}{dt} = i\omega\varepsilon_r C_o V$$

The complex dielectric constant can be defined as:

$$\in_r = \in'_r - i\in'_r$$

where:
$\in_r$=the complex dielectric constant;
$\in_{r'}$=the real part of the complex dielectric constant;
$\in_{r''}$=the imaginary part of the complex dielectric constant.

Therefore the current through a lossy capacitor becomes $$I = i\omega\in_r C_0 V = i\omega\in'_r C_0 V + \omega\in'_r C_0 V$$

The tangent of the loss angle is the ratio of the imaginary to the real component of the dielectric constant:

$$\tan(\delta) = \frac{\varepsilon'_r}{\varepsilon'_r}$$

As a result, the resistance contributing to leakage current in AC regime can be described as $$R_{leak} = \frac{1}{\omega\tan(\delta)C}$$

And the bulk-AC conductivity of the material becomes:

$$\sigma = \in_0 \in'_r \omega \tan(\delta)$$

where:
σ=the bulk-AC conductivity of the dielectric material;
$\in_0$=the permittivity of free space=8.89×10−14 F/cm;
$\in_r$=the real part of the dielectric constant;
tan(δ)=the dissipation factor of the dielectric;
δ=the loss angle of the dielectric;
ω=angular frequency=2×π×f, with f=the sine-wave frequency.

From the above derivation the conductance of the dielectric is proportional to the mobility of dipoles and reducing this mobility will affect the loss. As the electric field strength is increased, the degree of polarization keeps increasing. For a certain value of the dielectric field, all electric dipoles align themselves. The dielectric material in such a state is said to be saturated. The movement of dipoles is governed by the varying electric field due to transmitted signal. However, the field generated by the signal is typically limited to tens of V/cm. If an additional external field is applied with a field value forcing the dipoles in the saturation regime, dipole movement due to signal variation will be negligible or significantly reduced compared to typical prior art devices. Consequently, conductivity of the dielectric would be increased, leading to a decrease in dielectric loss of the material.

According to embodiments such an external electric field is applied between two metal plates located above and below the interconnect PCB with a DC voltage applied between the plates. The voltage necessary to induce the required electric field is chosen to be high enough to saturate dipole polarization yet low enough not to exceed the breakdown voltage of the PCB material, and is preferably in range from 1 kV to 10 kV, but this value will be dependent on the material that is being used as a dielectric. This concept of embodiments is generally applicable to conductors, e.g. a differential pair microstrip or stripline on PCB, or a shielded/unshielded twisted pair, embedded inside or on the top surface of any type of dielectric material where DC voltage can be induced between one or more signal conductors and the return path, or between the signal conductors.

This is illustrated in FIGS. 1A-C. FIG. 1A shows a typical set-up of conductors according to the prior art, where the dipoles 1 in the dielectric material will move with a varying electric field. In the embodiment of FIG. 1A the conductors comprise two signal traces 2 and two return paths 3 embedded in a PCB 4. FIGS. 1B and 1C illustrate two embodiments where a high electric field is applied at least in the area of the dielectric substantially between the signal traces 2 and the return path(s) 3. In the embodiment of FIG. 1B the dipoles 1 are forced in the saturation regime by a high electric field represented by field lines 8. The high electric field is caused by a voltage 7 which is applied between electrodes 5 and 6 located on a top side and a bottom side of the PCB 4, such that the dipoles 1 are oriented vertically. In the embodiment of FIG. 1C the dipoles 1 are forced in the saturation regime by a high electric field between electrodes 5 and 6 located on a left side and a right side of the PCB 4, such that the dipoles 1 are oriented horizontally. To that end a voltage source 7 applies an appropriate voltage across the electrodes 5, 6. In both embodiments the dipoles 1 are forced in the saturation regime such that the dipole movement due to signal variation becomes negligible, leading to a decrease in dielectric loss without significantly increasing the cost or power consumption of the set-up.

FIG. 2 illustrates a first embodiment of a transmission device of the invention in a configuration where the electrodes 105, 106, also called polarizing planes, are located above and below an edge-coupled differential pair 102, 103 extending between a receiver (Rx) 109 and a transmitter (Tx) 110. The transmitter 110 is supplied with a supply voltage 121, and the receiver is supplied with a supply voltage 120. A positive voltage 108 with respect to ground 113 is applied on the top electrode 105 and a negative voltage 107 is applied with respect to ground 113 on the bottom electrode 106. In the illustrated embodiment the distance between the top electrode 105 and the conductors 102, 103 is substantially equal to the distance between the bottom electrode 106 and the conductors, and the value of the positive and negative voltage may also be substantially equal, but the skilled person understands that this may also not be the case. The ground reference is preferably a ground reference to one of the transmitter 110 or receiver chip 109 supply rails, and typically the ground of the transmitter or the receiver inputs are typically AC-coupled through AC coupling capacitors 111.

FIG. 3 illustrates a second embodiment of the invention in a configuration where a single electrodes 205, also called polarizing plane, is located below an edge-coupled differential pair 202, 203 extending between a receiver 209 and a transmitter 210. The transmitter 210 is supplied with a supply voltage 221, and the receiver is supplied with a supply voltage 220. In this embodiment the differential pair is located on top of a PCB 204 but the skilled person understands that the conductors 202, 203 could also be embedded in the PCB 204. The electrode 205 is embedded in the PCB 204. A positive voltage 207 with respect to ground 213 is applied on the electrode 205, but the skilled person understands that a negative voltage can be used as well. The ground reference 213 is here also a ground reference to the transmitter 210, and the receiver inputs are AC-coupled through optional AC coupling capacitors 211. Further optional capacitors 212 may be provided for restoring the return path.

Figure 4:
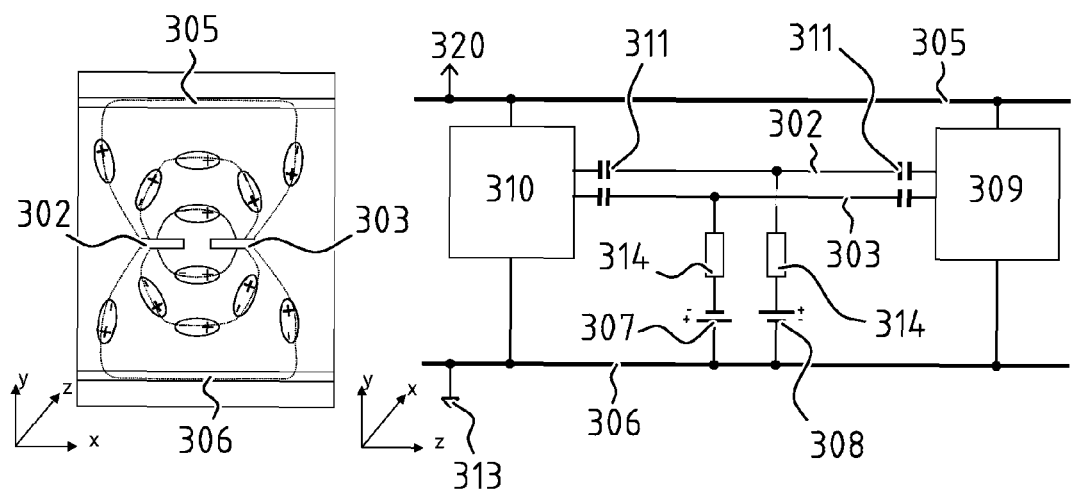
FIG. 4 illustrates a third embodiment of a transmission device.

FIG. 4 illustrates a third embodiment of the invention in a configuration where two electrodes 305, 306 are located above and below an edge-coupled differential pair 302, 303 extending between a receiver 309 and a transmitter 310. The transmitter 310 and the receiver 309 are supplied with a supply voltage 320. A positive polarizing voltage 308 with respect to ground 313 is applied on a first trace 302 of the differential pair and a negative polarizing voltage 307 is applied with respect to ground 313 on a second trace 303 of the differential pair. The electrodes 305 and 306 are respectively connected to the supply voltage 320 of the transmitter/receiver and to the ground 313. The ground reference 313 is preferably also a ground reference to the transmitter 310 and receiver chip 309. In this embodiment both the transmitter outputs and the receiver inputs are AC-coupled through AC coupling capacitors 311, preferably high-breakdown voltage capacitors. The polarizing voltage sources 307 and 308 may impact the impedance control of the differential trace, but this can be avoided by adding high impedance resistors 314. The skilled person will understand that the third embodiment is also applicable to shielded/unshielded twisted pair. The major advantage of this third embodiment is that the polarizing planes 305 and 306 can be used as supply rail for active components and still act as polarizing planes. The skilled person understands that it is not necessary that both transmitter and receiver are powered by the same supply rail voltage.

Figure 5:
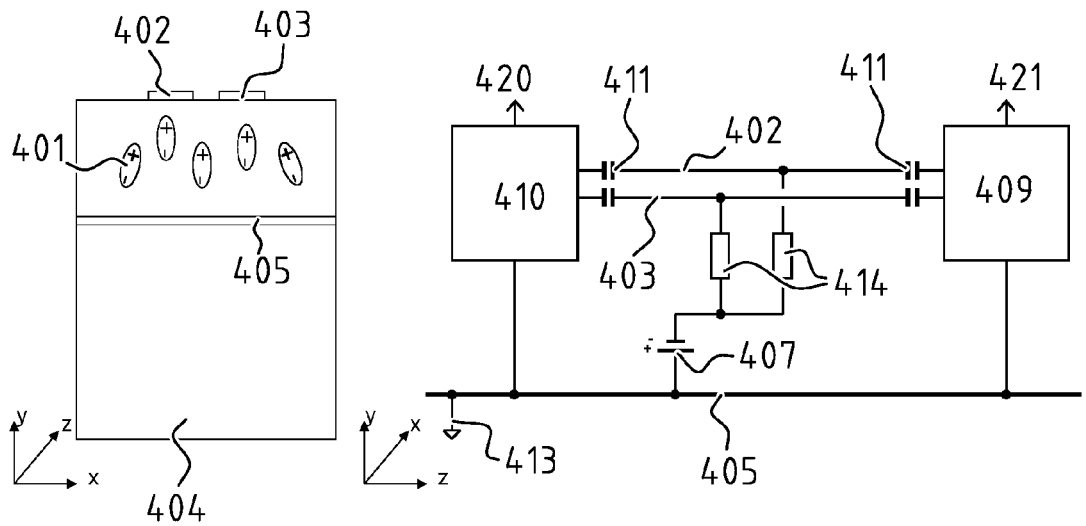
FIG. 5 illustrates a fourth embodiment of a transmission device.

FIG. 5 illustrates a fourth embodiment of the invention in a configuration where a single electrode 405 is located below an edge-coupled differential pair 402, 403 extending between a receiver 409 and a transmitter 410. In this embodiment the differential pair is located on top of the PCB 404 but the skilled person understands that the conductors 402, 403 could also be embedded in the PCB 404. Similar, a skilled person understands that the polarizing plane 405 may be at the surface of PCB 404. A negative voltage 407 with respect to ground is applied on the signal traces 402, 403, and the electrode 405 is grounded 413. Resistors 414 are used to put the polarizing voltage 407 on the differential transmission lines 402, 403 without shorting them to each other. The skilled person understands that also a positive voltage can be used for 407. The ground reference 413 is here also a ground reference to the transmitter 410 and the receiver 409. In this embodiment both the transmitter outputs and the receiver inputs are AC-coupled through AC coupling capacitors 411, preferably high-breakdown voltage capacitors. The polarizing voltage source 407 and polarizing resistors 414 may impact the impedance control of the differential trace, but this can be avoided by using high impedance resistors 414.

Figure 6:
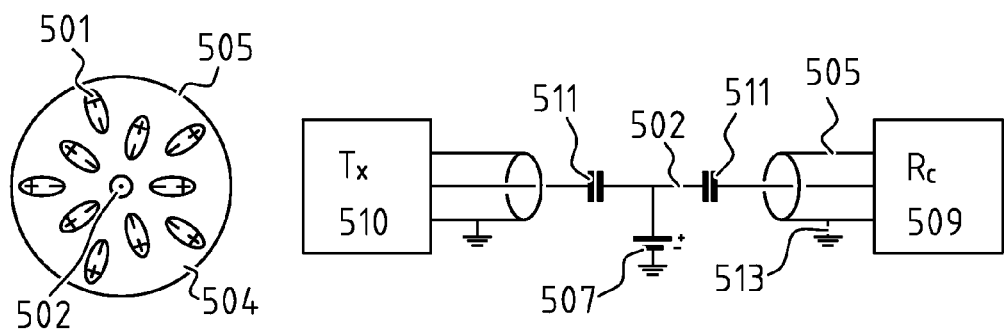
FIG. 6 illustrates a fifth embodiment of a transmission device.

FIG. 6 illustrates a fifth embodiment of a transmission device comprising a coaxial cable with a central conductor 502 which is surrounded by a dielectric material 504 containing dipoles 501. The dielectric material 504 is surrounded by an outer electrode 505. The coaxial cable is used between a transmitter 510 and a receiver 509. A voltage 507 is applied to the central conductor 502, whilst the outer electrode 505 is connected to ground 513. Also in this embodiment the dipoles 501 are forced in the saturation regime such that the dipole movement due to signal variation on the central conductor 502 becomes negligible, leading to a decrease in dielectric loss without significantly increasing the cost or power consumption of the device. Optional AC-coupling capacitors 511 are provided for the coupling with the transmitter 510 and receiver 509. The skilled person understands that the polarizing voltage may be applied to the outer conductor 505 instead of to the inner conductor 502. In this case the optional AC-coupling capacitors are typically relocated to the outer conductor.

Whilst the principles of the invention have been set out above in connection with specific embodiments, it is to be understood that this description is merely made by way of example and not as a limitation of the scope of protection which is determined by the appended claims.

What is claimed is:

1. Transmission device comprising
    at least one conductor for the transmission of an AC signal and a dielectric material at least partly surrounding the at least one conductor,
    the dielectric material comprising dipoles, further comprising a dipole orienting system configured to orient the dipoles and to force the dipoles in a saturation regime in order to limit the movement of the dipoles when the at least one conductor conducts an AC signal;
    the dipole orienting system including at least one electrode for applying an electric field using at least one voltage source, the at least one electrode being located such that the electric field is created in the dielectric material, and such that, in operation, the at least one voltage source causes the electric field in the dipoles to be higher than 1kV/cm.

2. Transmission device of claim 1, wherein the at least one conductor comprises two conductors electrically coupled to each other through the dielectric material.

3. Transmission device of claim 1, wherein the at least one conductor is part of any one of the following: a differential pair microstrip, a strip line, a shielded or unshielded twisted pair, a coaxial cable.

4. Transmission device of claim 1, wherein each of the at least one conductor takes the form of a strip.

5. Transmission device, comprising:
    at least one conductor for the transmission of an AC signal and a dielectric material at least partly surrounding the at least one conductor, the dielectric material comprising dipoles, further comprising a dipole orienting system configured to orient the dipoles and to force the dipoles in a saturation regime in order to limit the movement of the dipoles when the at least one conductor conducts an AC signal, wherein the device comprises a PCB and the dielectric material is part of the PCB.

6. Transmission device of claim 5, further comprising
    a transmitter;
    and a receiver, the at least one conductor extending between the transmitter and the receiver.

7. Transmission device of claim 6, wherein the transmitter, the receiver and an electrode of the dipole orienting system are connected to a voltage reference, and the at least one voltage source is applying a voltage between the voltage reference, and the at least one conductor.

8. Transmission device of claim 5, wherein the transmitter and the receiver are connected to a voltage reference, the dipole orienting system includes at least one electrode, the at least one electrode is configured to apply an electric field using at least one voltage source, and each voltage source of the at least one voltage source is configured to apply a voltage between an electrode of the at least one electrode and the voltage reference.

9. Transmission device of claim 5, wherein the at least one conductor is located on an outer side of the PCB or is embedded in the PCB.

10. Transmission device of claim 5, wherein the at least one electrode is located on an outer side of the PCB or is embedded in the PCB.

11. Transmission device of claim 5, wherein the dipole orienting system comprises a supply voltage circuit for applying a voltage between at least one electrode and the at least one conductor such that an electric field is created in the dielectric material, the at least voltage being such that the electric field forces the dipoles in the saturation regime.

12. Transmission device of claim 11, wherein each of the first and second electrodes and each of the at least one conductors takes the form of a metal strip, each of the first and second electrodes having a width which is larger than the width of one of the at least one conductor, the first and second electrodes and the one of the at least one conductor being arranged parallel to each other.

13. Transmission device of claim 5, wherein the dipole orienting system comprises a first and a second electrode, located at opposite sides of the at least one conductor, and a supply voltage circuit for applying a voltage between the first and the second electrode such that an electric field is created in the dielectric material, the voltage being such that the electric field forces the dipoles in the saturation regime.

14. Transmission device comprising:
at least one conductor for the transmission of an AC signal;
a dielectric material at least partly surrounding the at least one conductor;
the dielectric material comprising dipoles;
a dipole orienting system configured to orient the dipoles and to force the dipoles in a saturation regime in order to limit the movement of the dipoles when the at least one conductor conducts the AC signal; and
the at least one conductor is one of a differential pair microstrip, or a shielded or unshielded twisted pair.

* * * * *